United States Patent [19]

Mandai et al.

[11] Patent Number: 5,384,434
[45] Date of Patent: Jan. 24, 1995

[54] MULTILAYER CERAMIC CIRCUIT BOARD

[75] Inventors: Harufumi Mandai; Kimihide Sugo, both of Kyoto, Japan

[73] Assignee: Murata Manufacturing Co., Ltd., Kyoto, Japan

[21] Appl. No.: 24,537

[22] Filed: Mar. 1, 1993

[30] Foreign Application Priority Data

Mar. 2, 1992 [JP] Japan .................. 4-081648
Mar. 2, 1992 [JP] Japan .................. 4-081649

[51] Int. Cl.6 .................................. H05K 1/00
[52] U.S. Cl. ........................ 174/258; 174/250; 174/257; 174/259; 361/761; 361/762; 361/763; 361/766
[58] Field of Search .......... 174/258, 255, 250, 256, 174/257, 259; 228/179, 180.1, 180.2; 361/761, 762, 763, 766, 784, 785, 790, 791, 792, 793; 428/901

[56] References Cited

U.S. PATENT DOCUMENTS

| | | |
|---|---|---|
| 4,424,615 | 1/1984 | Wakino . |
| 4,574,329 | 3/1986 | Eijkelenkemp et al. . |
| 4,613,918 | 9/1986 | Kanai et al. . |
| 4,706,162 | 11/1987 | Hernandez et al. . |
| 4,956,114 | 9/1990 | Watanabe et al. . |
| 5,113,300 | 5/1992 | Ikeda et al. . |
| 5,119,266 | 6/1992 | Petry . |
| 5,165,984 | 11/1992 | Schoenthaler .......... 174/250 |
| 5,177,670 | 1/1993 | Shinohara et al. . |

*Primary Examiner*—Leo P. Picard
*Assistant Examiner*—Cheryl R. Figlin
*Attorney, Agent, or Firm*—Ostrolenk, Faber, Gerb & Soffen

[57] ABSTRACT

A dielectric substrate element of a multilayer structure provided with a capacitor in its interior and a magnetic substrate element of a multilayer structure provided with an inductor in its interior are prepared independently of each other. These substrate elements are respectively fired, then superposed with each other, and electrically connected and mechanically bonded by solder bumps to be integrated with each other. Thus, it is possible to obtain a multilayer ceramic circuit board with no integral firing, and the materials for the dielectric substrate element and the magnetic substrate element are not restricted in their capability of integral firing.

17 Claims, 5 Drawing Sheets

MULTILAYER CERAMIC CIRCUIT BOARD

BACKGROUND OF THE INVENTION

1. Field of the Invention

The present invention relates to a multilayer ceramic circuit board, and more particularly, it relates to a multilayer ceramic circuit component which includes at least two types of ceramic portions having different electric characteristics.

2. Description of the Background Art

Figure 12:
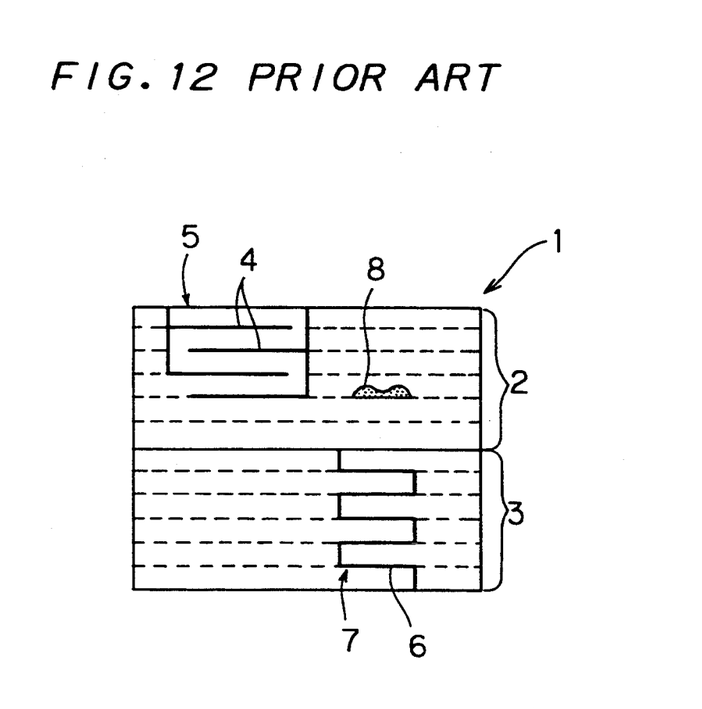
FIG. 12 is a sectional view schematically showing a conventional multilayer ceramic circuit board.

FIG. 12 shows an example of a conventional multilayer ceramic circuit board. This multilayer ceramic circuit board 1 is formed by superposing a dielectric ceramic portion 2 and a magnetic ceramic portion 3 and integrating the portions 2 and 3 with each other. The dielectric ceramic portion 2 has capacitor 5 formed in its interior. The capacitor 5 is formed by a plurality of electrodes 4 arranged in layers. On the other hand, the magnetic ceramic portion 3 has an inductor 7 which is formed by a conductor 6 having a helical structure. Further, a thick film resistor 8 is provided in the interior of the dielectric ceramic portion 2.

The dielectric ceramic portion 2 contains a ceramic material of a Pb composite perovskite system or a $BaTiO_3$ system, for example, while the magnetic ceramic portion 3 contains a magnetic ceramic material of an Mn—Zn ferrite system or an Ni—Zn ferrite system, for example. The thick film resistor 8 contains a resistive material of a ruthenium system or a lanthanum system, for example.

Such a multilayer ceramic circuit board 1 is manufactured by stacking a plurality of dielectric green sheets and a plurality of magnetic green sheets respectively, heating the laminates under pressure, and then integrally firing the same. Conductive paste for defining the electrodes 4 and resistive paste for forming the thick film resistor 8 are previously applied to some of the dielectric green sheets. On the other hand, conductive paste for defining the conductor 6 is previously applied to some of the magnetic green sheets.

In the integral firing for obtaining the aforementioned multilayer ceramic circuit board t, however, it is necessary to match shrinkage factors of the different materials with each other in firing as well as to suppress mutual diffusion of components between the different materials. Therefore, the aforementioned dielectric and magnetic materials cannot be directly applied to the dielectric and magnetic ceramic portions 2 and 3 and proper additives are generally added to such materials. When the dielectric ceramic portion 2 contains a $BaTiO_3$ dielectric ceramic material and the magnetic ceramic portion 3 contains an Ni—Zn ferrite magnetic material, for example, glass is employed for the former and CuO is employed for the latter as additives.

However, the dielectric and magnetic materials containing such additives are inferior in electric characteristics such as dielectric constants, Q values and permeabilities to those containing no additives, and hence characteristics of the capacitor 5 and the inductor 7 are disadvantageously deteriorated.

Further, the materials which are rendered capable of integral firing in the aforementioned manner are so sensitive to firing conditions that the capacitor 5 and the inductor 7 are deficient in stability of characteristics, leading to an inferior production yield of the multilayer ceramic circuit board 1 obtained by integral firing. In relation to this problem, the respective ones of the capacitor 5 and the inductor 7 as well as the thick film resistor 8 may be trimmed to be provided with desired characteristic values. In the example shown in FIG. 12, however, it may be almost impossible to trim an electric element, such as the thick film resistor 8, because the film resistor is located deeply in the interior of the multilayer ceramic circuit board 1.

The problem caused in the aforementioned multilayer ceramic circuit board 1 may also take place in another multilayer ceramic circuit board which includes at least two types of ceramic portions having different electric characteristics. For example, a problem substantially similar to the above is caused when a multilayer ceramic circuit board including a ceramic portion having a relatively low dielectric constant and that having a relatively high dielectric constant is obtained by integral firing. Dielectric members having low and high dielectric constants are thus integrated with each other since a dielectric member having a low dielectric constant exhibits an excellent temperature characteristic although the as-obtained electrostatic capacitance is small while a dielectric member having a high dielectric constant can obtain high electrostatic capacitance although its temperature characteristic is inferior in general and it may be preferable to utilize such advantages of these members in a single multilayer ceramic circuit board. The dielectric member having a low dielectric constant is prepared from a dielectric ceramic material of an alumina-glass system of a $BaO-Al_2O_3-SiO_2$ system, for example. The dielectric member having a high dielectric constant is prepared from the aforementioned dielectric ceramic material of a $BaTiO_3$ system or a Pb composite perovskite system, for example.

SUMMARY OF THE INVENTION

Accordingly, an object of the present invention is to provide a multilayer ceramic circuit board, materials for which are not restricted in their capability of integral firing.

Another object of the present invention is to provide a multilayer ceramic circuit board which causes no mutual diffusion between components of different materials.

Still another object of the present invention is to improve performance and stability of characteristics of electrical components, such as a capacitor and an inductor, which are formed in a multilayer ceramic circuit board.

A multilayer ceramic circuit board according to the present invention includes a first substrate element containing a fired first ceramic material, a second substrate element, which is superposed on the first substrate element, the second substrate element containing a fired second ceramic material having electric characteristics different from those of the first ceramic material, and a conductive bonding means for electrically connecting and mechanically bonding the superposed first and second substrate elements for integrating the first and second substrate with each other.

Thus, the multilayer ceramic circuit board according to the present invention has a structure obtained by superposing already fired first and second substrate elements and integrating the superposed first and second substrate elements with each other by a conductive bonding means. Namely, no integral firing is employed to integrate the first and second substrate elements with each other. Therefore, the ceramic materials contained in the respective ones of the first and second substrate elements are not restricted in their capability of integral firing. Further, no mutual diffusion of components is caused by integral firing between the first and second substrate elements. Thus, it is possible to improve performance of electrical components such as a capacitor and an inductor formed in the first and second substrate elements, respectively and to stabilize characteristics thereof.

In a preferred embodiment of the present invention, the aforementioned first and second ceramic materials are dielectric and magnetic ceramic materials, respectively. In this case, the first substrate element is provided with a capacitor in its interior, and has a multilayer structure. On the other hand, the second substrate element is provided with an inductor in its interior. The second substrate element may have either a multilayer or single-layer structure.

In another preferred embodiment of the present invention, the first and second ceramic materials are dielectric ceramic materials having a relatively low dielectric constant and a relatively high dielectric constant, respectively. In this case, the first and second substrate elements have multilayer structures, respectively, and at least one of the first and second substrate elements is provided with a capacitor in its interior.

A clearance may be defined between the first and second substrate elements. A thick film resistor which is formed on at least one of the first and second substrate elements may be arranged in this clearance. Further, this clearance may be filled up with an electrical insulating material.

The aforementioned electrical components such as the capacitor, the inductor and the thick film resistor can be relatively easily trimmed as needed in stages before superposition of the first and second substrate elements. In this point, it is possible to improve the production yield of the multilayer ceramic circuit board.

The aforementioned conductive bonding means is preferably provided by bumps of a conductive material which are located between opposite surfaces of the first and second substrate elements. These bumps are made of solder, a brazing filler metal or a conductive binder, for example. Cavities may be formed in one of the opposite surfaces of the first and second substrate elements, so that parts of the bumps are located in these cavities.

In place of the aforementioned bumps, the conductive bonding means may be provided by first and second films of conductive materials, which are provided on end portions of the first and second substrate elements, respectively, to be bonded with each other. Alternatively, the conductive bonding means may be provided by metal pins passing through the first and second substrate elements.

The multilayer ceramic circuit board according to the present invention may further include at least one third substrate element which is superposed on at least one of the first and second substrate elements, and a second conductive bonding means for electrically connecting and mechanically bonding the third substrate element to at least one of the first and second substrate elements for integrating the third substrate element with the fourth substrate element. The third substrate element contains a fired third ceramic material having electric characteristics which are different from those of at least one of the first and second ceramic materials.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
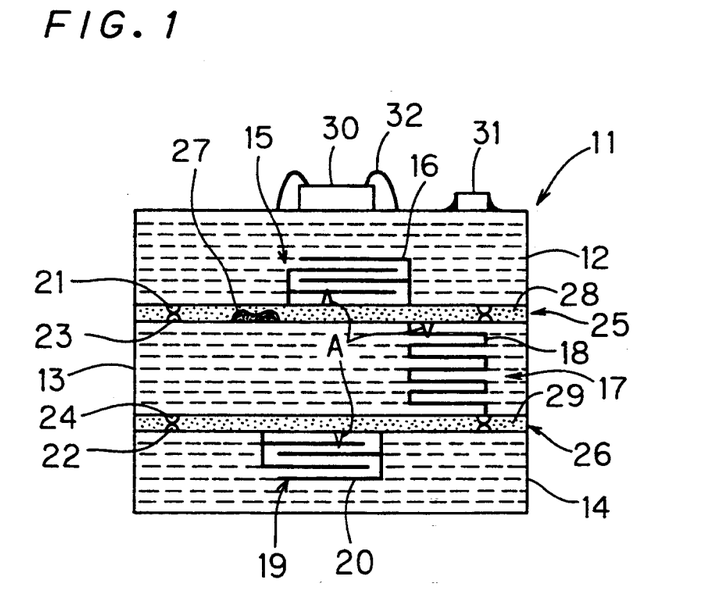
FIG. 1 is a sectional view schematically showing a multilayer ceramic circuit board according to an embodiment of the present invention.

Referring to FIG. 1, a multilayer ceramic circuit board 11 includes a dielectric substrate element 12, a magnetic substrate element 13 which is superposed thereon, and another dielectric substrate element 14 which is superposed thereon. The dielectric substrate elements 12 and 14 contain fired dielectric ceramic materials, respectively. On the other hand, the magnetic substrate element 13 contains a fired magnetic ceramic material. The substrate elements 12, 13 and 14 each have multilayer structures.

The dielectric substrate element 12 is provided with a plurality of capacitors including a capacitor 15 in its interior. The capacitor 15 is provided by a plurality of electrodes 16 which are arranged in the form of layers. On the other hand, the magnetic substrate element 13 is provided with a plurality of inductors including an inductor 17 in its interior. The inductor 17 is provided by a conductor 18 having a helical structure. Further, the dielectric substrate element 14 is provided with a plurality of capacitors including a capacitor 19 in its interior. The capacitor 19 is provided by a plurality of electrodes 20 which are arranged in the form of layers.

In order to electrically connect and mechanically bond the substrate elements 12, 13 and 14 which are superposed in the aforementioned manner with each other for integrating the same, bumps 21 and 22 are provided on single surfaces of the substrate elements 12 and 14, respectively, while bumps 23 and 24 are provided on both surfaces of the substrate element 13 in positions corresponding to the bumps 21 and 22, respectively. These bumps 21 to 24, which are made of solder or another conductive material such as a brazing filler metal or a conductive binder, for example, are so heated that the bumps 21 and 22 are bonded to the bumps 23 and 24, respectively.

Due to such provision of the bumps 21 to 24, clearances 25 and 26 are defined between the substrate elements 12, 13 and 14 respectively. According to this embodiment, a thick film resistor 27 is formed on the magnetic substrate element 13 in the clearance 25. These clearances 25 and 26 may be filled up with electrical insulating materials 28 and 29 of glass having a low melting point or a binder, for example. The electrical insulating materials 28 and 29 are adapted to improve bonding strength between the substrate elements 12 to 14 and to seal spaces in the clearances 25 and 26 against the exterior.

The dielectric ceramic materials contained in the dielectric substrate elements 12 and 14 are prepared from that of a Pb composite perovskite system or a $BaTiO_3$ system, for example. On the other hand, the magnetic ceramic material contained in the magnetic substrate element 13 is prepared from that of an Mn—Zn ferrite system or an Ni—Zn ferrite system, for example. The thick film resistor 27 is made of a resistive material of a ruthenium system or a lanthanum system, for example.

Some electronic components are carried on the surface of the multilayer ceramic circuit board 11 as needed. According to this embodiment, an IC chip 30 and a chip component 31 such as a chip capacitor or a chip resistor are carried on the upper surface of the dielectric substrate element 12. The IC chip 30 is electrically connected to the dielectric substrate element 12 by bonding wires 32.

The bumps 21 to 24, the thick film resistor 27, the IC chip 30 and the chip component 31 are electrically connected with electrodes which are formed in the interiors or surfaces of corresponding ones of the substrate elements 12 to 14, while such electrodes are not shown in FIG. 1.

The aforementioned multilayer ceramic circuit board 11 is manufactured in the following manner, for example:

(1) A plurality of dielectric green sheets are stacked, heated under pressure and then fired to prepare the dielectric substrate elements 12 and 13 respectively. Conductive paste for defining the electrodes 16 and 20 is applied to some of the dielectric green sheets. The capacitors 15 and 19 are trimmed as needed. Referring to FIG. 1, symbol A denotes trimming impressions. The as-obtained dielectric substrate elements 12 and 14 are formed with the bumps 21 and 22, respectively.

(2) A plurality of magnetic green sheets are stacked, heated under pressure and then fired to prepare the magnetic substrate element 13. Conductive paste for defining the conductor 18 is applied to some of the plurality of magnetic green sheets. The inductor 17 is trimmed as needed. Referring to FIG. 1, symbol A also denotes a trimming impression of the inductor 17. The magnetic substrate element 13 is formed with the bumps 23 and 24 on both surfaces thereof. The magnetic substrate element 13 is also formed on its one surface with the thick film resistor 27, which is also trimmed as needed.

(3) The dielectric substrate elements 12 and 14 and the magnetic substrate element 13 prepared in the aforementioned steps (1) and (2), respectively, are superposed with each other and heat treated. Thus, the bumps 21 and 22 are bonded to the bumps 23 and 24, respectively, whereby the multilayer ceramic circuit board 11 is obtained.

The magnetic substrate element 13 may have a single-layer structure, depending on the structure of the inductor to be formed therein. Further, the order of superposition of the substrate elements 12 to 14 can be arbitrarily changed.

According to the aforementioned embodiment, the dielectric and magnetic materials employed for the dielectric substrate elements 12 and 14 and the magnetic substrate element 13 are not restricted in view of capability of integral firing, and no mutual diffusion of components is caused between the dielectric and magnetic materials. Further, the material for the thick film resistor 27 also requires no condition of withstanding firing of the ceramic materials.

According to this embodiment, further, it is possible to relatively easily trim the electrical components, which are hard to trim after integration of the substrate elements 12 to 14 in the multilayer ceramic circuit board 11, by carrying out the trimming steps during the preparation of the substrate elements 12 to 14.

Figure 2:
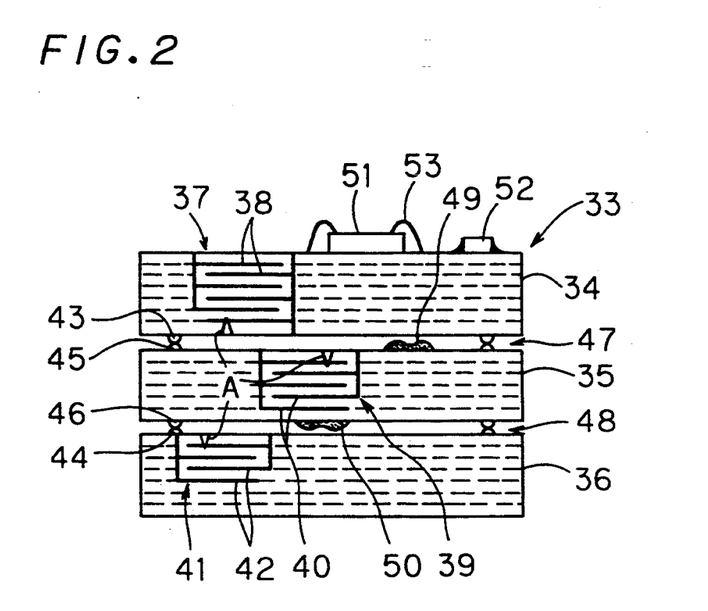
FIG. 2 is a sectional view schematically showing a multilayer ceramic circuit board according to another embodiment of the present invention.

FIG. 2 illustrates a multilayer ceramic circuit board 33 according to another embodiment of the present invention. This multilayer ceramic circuit board 33 includes first, second and third dielectric substrate elements 34, 35 and 36. The first and third dielectric substrate elements 34 and 36 contain fired dielectric ceramic materials having relatively low dielectric constants, while the second dielectric substrate element 35 contains a fired dielectric ceramic material having a relatively high dielectric constant. These substrate elements 34 to 36 each have multilayer structures.

The first dielectric substrate element 34 is provided with capacitors including a capacitor 37 in its interior. The capacitor 37 is provided by a plurality of electrodes 38 which are arranged in the form of layers. On the other hand, the second dielectric substrate element 35 is provided with capacitors including a capacitor 39 in its interior. The capacitor 39 is provided by a plurality of electrodes 40 which are arranged in the form of layers. Further, the third dielectric substrate element 36 is provided with capacitors including a capacitor 41 in its interior. The capacitor 41 is provided by a plurality of electrodes 42 which are arranged in the form of layers. The first and third dielectric substrate elements 34 and 36 are provided on single surfaces thereof with bumps 43 and 44, respectively. On the other hand, the second dielectric substrate element 35 is provided on both surfaces thereof with bumps 45 and 46, respectively. The bumps 43 and 44 are bonded with the bumps 45 and 46, respectively.

Due to such provision of the bumps 43 to 46, clearances 47 and 48 are defined between the first, second and third dielectric substrate elements 34, 35 and 36, respectively. Thick film resistors 49 and 50 are formed on the respective surfaces of the second dielectric substrate element 35 in the clearances 47 and 48, respectively. The clearances 47 and 48 do not have to be filled up with electrical insulating materials, unlike the aforementioned embodiment.

The ceramic materials having low dielectric constants are prepared from an alumina-glass system or a $BaO—Al_2O_3—SiO_2$ system, for example. The ceramic material having a high dielectric constant is prepared from a $BaTiO_3$ system or a Pb composite perovskite system, for example. The thick film resistors 49 and 50 are made of a resistive material of a ruthenium system or a lanthanum system, for example.

An IC chip 51 and a chip component 52 are carried on the surface of the multilayer ceramic circuit board 33, more specifically the upper surface of the first dielectric substrate element 34. The IC chip 51 is electrically connected to the first dielectric substrate element 34 through bonding wires 53. FIG. 2 shows no electrodes which are electrically connected with the respective ones of the bumps 43 to 46, the thick film resistors 49 and 50, the IC chip 51 and the chip component 52.

This multilayer ceramic circuit board 33 can be manufactured in a method substantially similar to that for the aforementioned multilayer ceramic circuit board 11.

In the multilayer ceramic circuit board 33, it is not necessary to form capacitors in all of the substrate elements 34 to 36. Further, the substrate elements 34 to 36 may be superposed in arbitrary order.

The aforementioned bumps 21 to 24 or 43 to 46 may be replaced by those obtained by a method hereafter described with reference to FIGS. 3 to 9.

Figure 3:
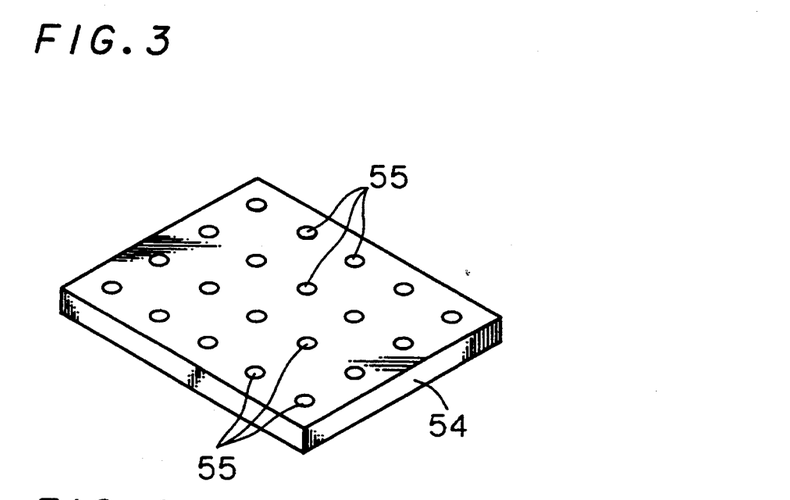
FIGS. 3 to 9 illustrate typical steps included in a preferable method of forming bumps.
Figure 4:
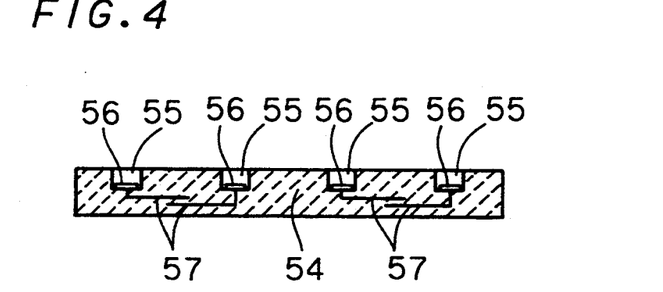

Referring to FIGS. 3 and 4, a plurality of cavities 55 are provided in one surface of a first substrate element 54. Electrode pads 56 are formed in the bottom surfaces of the cavities 55, to be electrically connected with circuit elements 57 which are provided in the substrate element 54.

Figure 5:
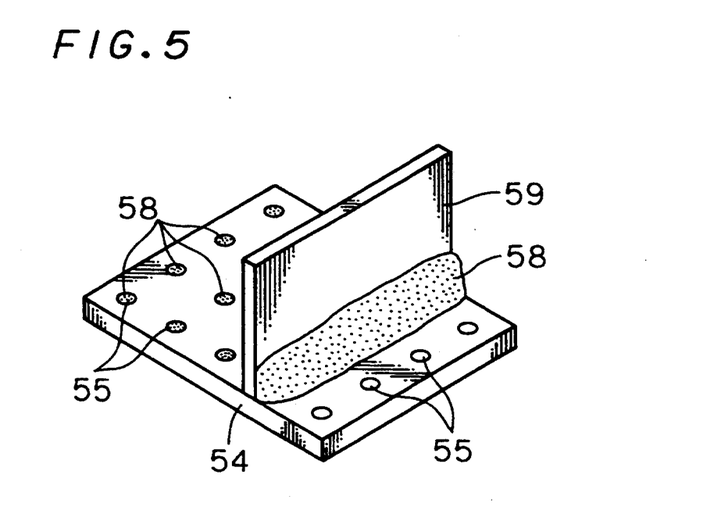
Figure 6:
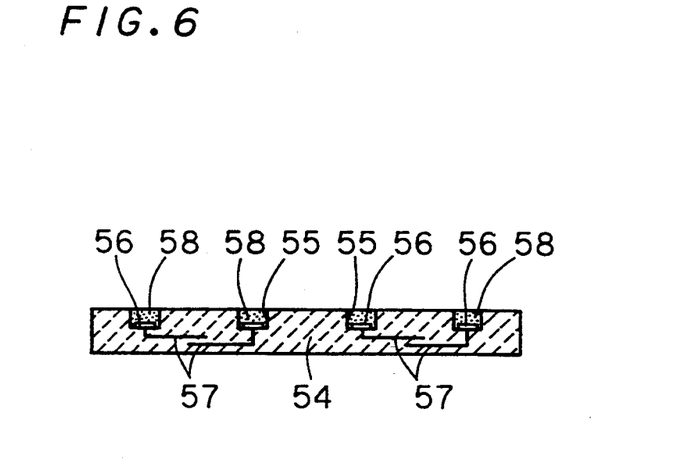

Then, the cavities 55 are filled up with solder paste 58, as shown in FIGS. 5 and 6. The solder paste 58 may be replaced by another conductive material. A squeegee 59 shown in FIG. 5 is employed for filling up the solder paste 58 in the cavities 55.

Figure 7:
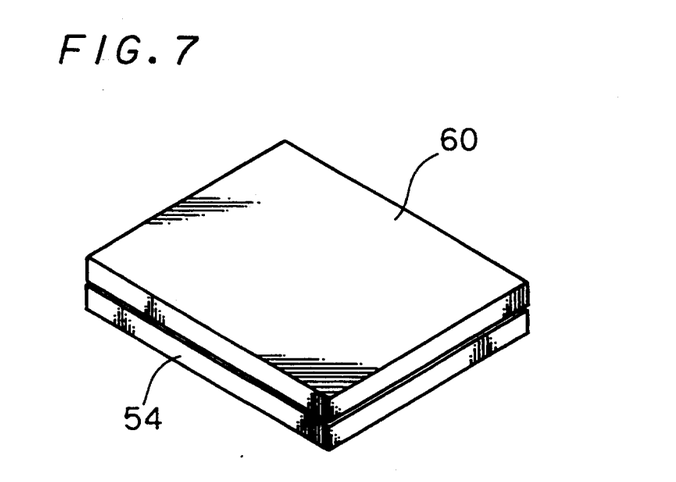
Figure 8:
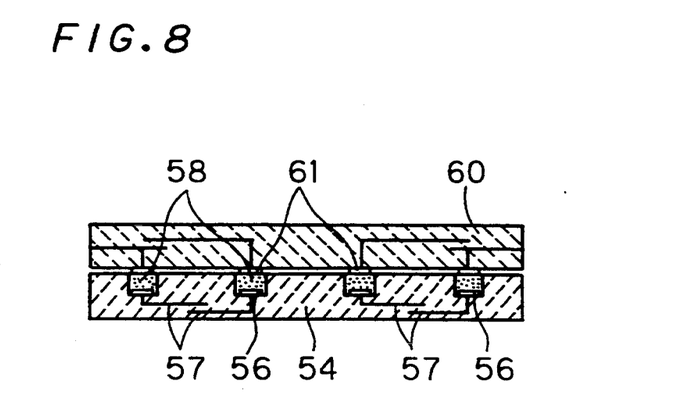
Figure 9:
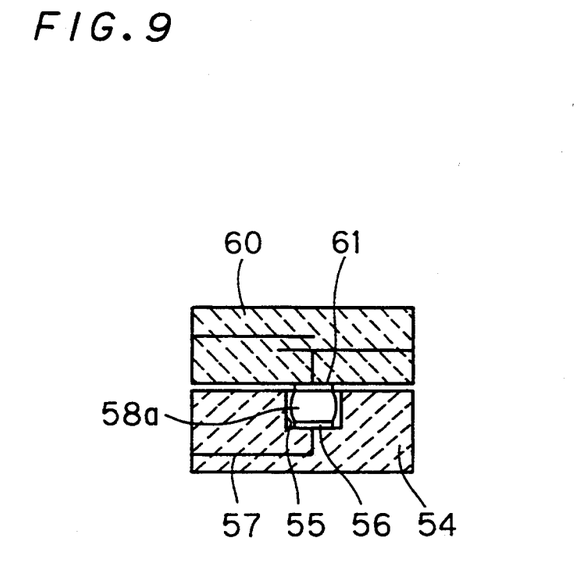

Then, a second substrate element 60 is superposed on the first substrate element 54, as shown in FIGS. 7 and 8. The second substrate element 60 is provided in a surface facing the first substrate element 54 with electrode Dads 61 in positions corresponding to the cavities 55. The first and second substrate elements 54 and 60 thus aligned with each other are introduced into a reflow furnace to be heated at a temperature exceeding that for melting the solder paste 58. Thus, the solder paste 58 is melted as shown in FIG. 9, to define a substantially semispherical bump 58a on each electrode pad 56 by its surface tension. Such bumps 58a electrically connect the electrode pads 56 and 61 of the first and second substrate elements 54 and 60 with each other while mechanically bonding and integrating the first and second substrate elements 54 and 60 with each other. After such heat treatment, a flux is washed out.

Figure 10:
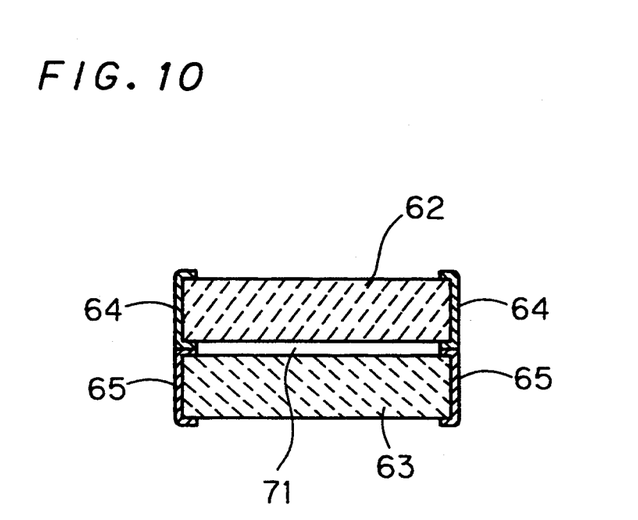
FIG. 10 is a sectional view schematically showing a multilayer ceramic circuit board according to still another embodiment of the present invention.
Figure 11:
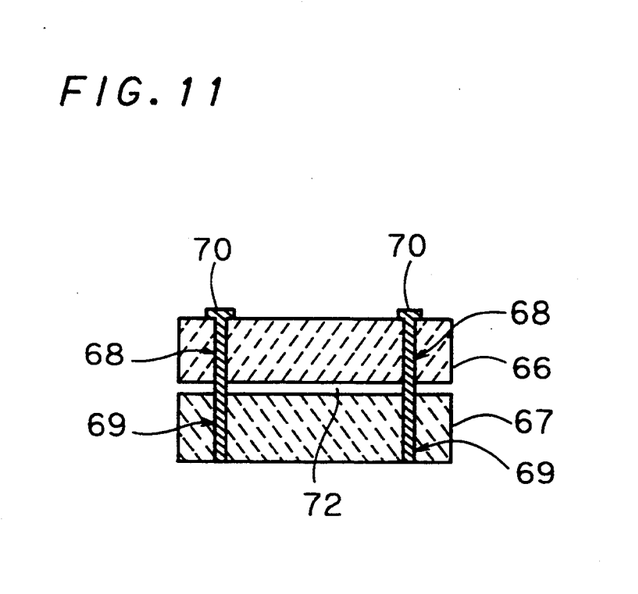
FIG. 11 is a sectional view schematically showing a multilayer ceramic circuit board according to a further embodiment of the present invention.

As to a conductive bonding means for electrically connecting and mechanically bonding at least two superposed substrate elements for integrating the same with each other, the aforementioned bumps may be replaced by means shown in FIG. 10 or 11.

FIG. 10 shows first and second substrate elements 62 and 63 which are superposed with each other. These substrate elements 62 and 63 are provided with electrodes 64 and 65 on respective end portions thereof. These electrodes 64 and 65 are electrically connected with electrodes (not shown) which are provided on the surfaces or in the interiors of the substrate elements 62 and 63 respectively. When the substrate elements 62 and 63 are still separated from each other, conductive paste is applied to define the electrodes 64 and 65, and then this conductive paste is baked after the substrate elements 62 and 63 are superposed with each other. Thus, the electrodes 64 and 65 are bonded to each other to integrate the substrate elements 62 and 63 with each other.

FIG. 11 shows first and second substrate elements 66 and 67 which are superposed with each other. These substrate elements 66 and 67 are provided with through holes 68 and 69 having conductive films which are formed on inner peripheral surfaces thereof to be electrically connected with electrodes (not shown) provided on the surfaces or in the interiors of the substrate elements 66 and 67, respectively. Metal pins 70 are inserted in the through holes 68 and 69, to be bonded to the conductive films provided on the inner peripheral surfaces of the through holes 68 and 69. Thus, the substrate elements 66 and 67 are electrically connected and mechanically bonded to be integrated with each other.

A clearance 71 between the substrate elements 62 and 63 shown in FIG. 10 or a clearance 72 between the substrate elements 66 and 67 shown in FIG. 11 may be filled up with an electrical insulating material which is similar to the electrical insulating materials 28 and 29 shown in FIG. 1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multilayer ceramic circuit board, comprising:
   a first substrate element containing a fired first ceramic material;
   a second substrate element, being superposed on said first substrate element, containing a fired second ceramic material having electric characteristics different from those of said first ceramic material and being fired separately from said first ceramic material; and
   conductive bonding means for electrically connecting and mechanically bonding said first and second substrate elements together for integrating the first and second substrate elements.

2. A multilayer ceramic circuit board in accordance with claim 1, wherein said first ceramic material is a dielectric ceramic material, and said second ceramic material is a magnetic ceramic material.

3. A multilayer ceramic circuit board in accordance with claim 2, wherein said first substrate element is provided with a capacitor in its interior and has a multilayer structure, and said second substrate element is provided with an inductor in its interior.

4. A multilayer ceramic circuit board in accordance with claim 3, wherein said second substrate element has a multilayer structure.

5. A multilayer ceramic circuit board in accordance with claim 1, wherein said first ceramic material is a dielectric ceramic material having a relatively low dielectric constant, and said second ceramic material is a dielectric ceramic material having a relatively high dielectric constant.

6. A multilayer ceramic circuit board in accordance with claim 5, wherein said first and second substrate elements each have multilayer structures.

7. A multilayer ceramic circuit board in accordance with claim 6, wherein at least one of said first and second substrate elements is provided with a capacitor in its interior.

8. A multilayer ceramic circuit board in accordance with claim 1, wherein the conductive bonding means is a first conductive bonding means and the multilayer ceramic circuit board further comprises at least one third substrate element being superposed on at least one of said first and second substrate elements and second conductive bonding means for electrically connecting and mechanically bonding said third substrate element with at least one of said first and second substrate elements and integrating the at least one of said first and second substrate elements with the third substrate element, said third substrate element containing a fired third ceramic material having electric characteristics being different from those of at least one of said first and second ceramic materials.

9. A multilayer ceramic circuit board in accordance with claim 1, wherein said conductive bonding means comprises bumps of a conductive material being located between opposite surfaces of said first and second substrate elements.

10. A multilayer ceramic circuit board in accordance with claim 9, wherein said bumps are made of solder.

11. A multilayer ceramic circuit board in accordance with claim 9, wherein cavities are formed in one of said opposite surfaces of said first and second substrate elements, parts of said bumps being located in said cavities.

12. A multilayer ceramic circuit board in accordance with claim 1, wherein said conductive bonding means comprises first and second films of a conductive material being provided on end portions of said first and second substrate elements, respectively, to be bonded to each other.

13. A multilayer ceramic circuit board in accordance with claim 1, wherein said conductive bonding means comprises metal pins passing through said first and second substrate elements.

14. A multilayer ceramic circuit board in accordance with claim 1, wherein a clearance is defined between said first and second substrate elements.

15. A multilayer ceramic circuit board in accordance with claim 14, wherein said clearance is filled up with an electrical insulating material.

16. A multilayer ceramic circuit board in accordance with claim 14, further comprising a thick film resistor being arranged in said clearance, said thick film resistor being formed on at least one of said first and second substrate elements.

17. A multilayer ceramic circuit board in accordance with claim 3, wherein one of opposite surfaces of said first and second substrate elements has an impression formed thereon, the impression resulting from the capacitor in the first substrate element or the inductor in the second substrate element being trimmed.

* * * * *